United States Patent
Von Kirchbauer et al.

(10) Patent No.: US 10,256,841 B2
(45) Date of Patent: Apr. 9, 2019

(54) ENCODER, DECODER AND ENCODING METHOD WITH LOW ERROR FLOOR

(71) Applicant: Xieon Networks S.à.r.l., Senningerberg (LU)

(72) Inventors: Heinrich Von Kirchbauer, Munich (DE); Stephan Witte, Munich (DE); Stefano Calabro, Munich (DE); Bernhard Spinnler, Oberhaching (DE)

(73) Assignee: Xieon Networks S.à.r.l., Luxembourg (LU)

( * ) Notice: Subject to any disclaimer, the term of this patent is extended or adjusted under 35 U.S.C. 154(b) by 0 days.

(21) Appl. No.: 15/533,912

(22) PCT Filed: Dec. 18, 2015

(86) PCT No.: PCT/EP2015/080428
§ 371 (c)(1),
(2) Date: Jun. 7, 2017

(87) PCT Pub. No.: WO2016/097263
PCT Pub. Date: Jun. 23, 2016

(65) Prior Publication Data
US 2017/0324429 A1      Nov. 9, 2017

(30) Foreign Application Priority Data
Dec. 19, 2014   (EP) .................................... 14199361

(51) Int. Cl.
*H03M 13/29*   (2006.01)
*H03M 13/11*   (2006.01)
*H03M 13/27*   (2006.01)

(52) U.S. Cl.
CPC ... *H03M 13/2906* (2013.01); *H03M 13/1108* (2013.01); *H03M 13/1111* (2013.01);
(Continued)

(58) Field of Classification Search
CPC .................................................. H03M 13/2957
(Continued)

(56) References Cited

U.S. PATENT DOCUMENTS

| | | | |
|---|---|---|---|
| 6,859,498 B1 * | 2/2005 | Choi | H04N 21/6377 375/240.27 |
| 7,835,259 B1 * | 11/2010 | Isaksen | H04L 25/0305 370/203 |
| 2012/0266051 A1 | 10/2012 | Farhoodfar et al. | |

OTHER PUBLICATIONS

Baggen, C.P.M., et al., "On Diamond Codes," IEEE Transactions on Information Theory, IEEE Press, USA, vol. 43 (5): 12 pages (1997) XP011026865.

(Continued)

*Primary Examiner* — Fritz Alphonse
(74) *Attorney, Agent, or Firm* — Nelson Mullins Riley & Scarborough LLP

(57) ABSTRACT

An encoder encodes digital data, said encoder includes one or more component encoders, one or more interconnections between component encoders, one or more inputs and one or more outputs. The encoder is configured to carry out the following steps: combining internal input bits received via an interconnection and external input bits received via a corresponding input, to assemble a local information word, encoding the local information word such as to generate a local code word, outputting a reduced local code word and handling the same reduced local code word over to the interconnect for forwarding the same reduced local code word to another component encoder or to itself, wherein the encoder is configured to forward on each interconnect the bits of the reduced local code in parallel but with delays that are mutually different for at least a subset of the reduced local code word bits.

28 Claims, 6 Drawing Sheets

Figure 1:
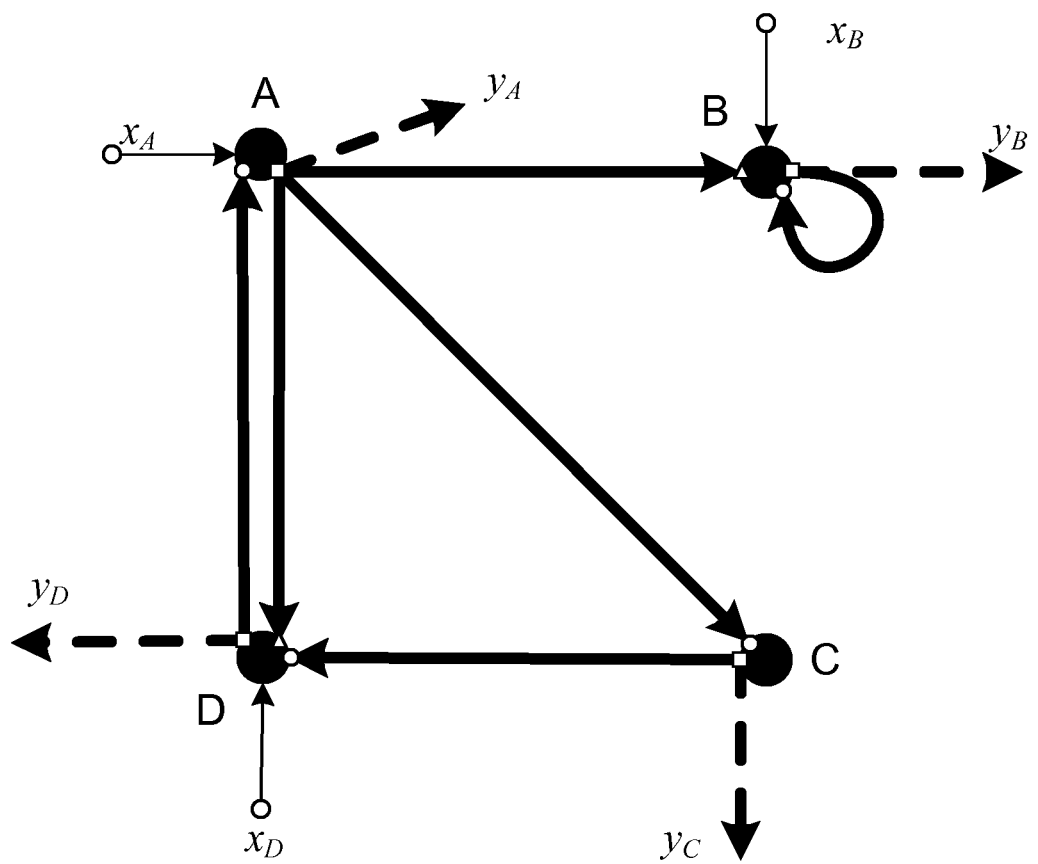

(52) U.S. Cl.
CPC .... *H03M 13/1174* (2013.01); *H03M 13/1191* (2013.01); *H03M 13/27* (2013.01)

(58) Field of Classification Search
USPC ........................................ 714/755, 757, 752
See application file for complete search history.

(56) References Cited

OTHER PUBLICATIONS

Feltrstrom A J., et al., "Braided Block Codes," IEEE Transactions on Information Theory, IEEE Press, USA, vol. 54 (6):2640-2658 (2009) XP011257976.

International Search Report and Written Opinion, PCT/EP2015/080428, dated Apr. 5, 2016, 13 pages.

Smith B.P., et al., "Staircase Codes: FEC for 100 Gb/s OTN," Journal of Lightwave Technology, IEEE Service Center, New York, NY, US, vol. 30 (1):110-117 (2012) XP011397841.

Feltström, A. et al., "Braided Block Codes," IEEE Transactions on Information Theory, vol. 55(6): 2640-2658 (2009).

Truhachev, D. et al., "On Braided Block Codes," ISIT 2003, Yokohama, Japan, Jun. 29-Jul. 4, 2003, Abstract only, 1 page.

Zhang, Z. et al., "Investigation of Error Floors of Structured Low-Density Parity-Check Codes by Hardware Emulation," IEEE, 1-4244-0357-X, 6 pages.

\* cited by examiner

ENCODER, DECODER AND ENCODING METHOD WITH LOW ERROR FLOOR

CROSS REFERENCE TO RELATED APPLICATIONS

This application is a 35 U.S.C. 371 national stage filing of International Application No. PCT/EP2015/080428, filed on Dec. 18, 2015, which claims priority to European Patent Application No. 14199361.8 filed on Dec. 19, 2014. The contents of the aforementioned applications are hereby incorporated by reference in their entireties.

FIELD OF THE INVENTION

The present invention is in the field of information transmission and information recording. In particular, the present invention is related to applications where high data rates are to be transmitted or recorded with a high reliability, in particular in optical communications or magnetic recording.

BACKGROUND AND RELATED PRIOR ART

In information theory, it has been established that over any given noisy communication channel by means of channel coding it is possible to transmit information nearly error-free up to a maximum rate, the so-called capacity, which depends on the channel transition probabilities. This result was first presented by Claude Shannon in 1948, and the corresponding theoretical maximum information transfer rate is therefore often referred to as the "Shannon-limit".

Practical codes that operate close to the Shannon-limit often exhibit a so-called "error floor". The "error floor" is a phenomenon encountered in modern error correcting codes with iterative decoding like LDPC codes or turbo codes, where the bit error ratio (BER)—which generally decreases with increasing signal-to-noise ratio (SNR)—at some point does not fall as quickly as before. The region in which the BER as a function of SNR flattens is referred to as the "error floor region".

On the other hand, codes that do not exhibit an error flow, like algebraic codes under bounded distance decoding, typically fall short of the Shannon limit.

A common solution to remove the error floor is to use an algebraic outer code to clean up the error floor of a high-performing inner code, as is for example described in DVB-S2 standard, ETSI EN 302 307, V1.2.1, April 2009. However, this approach implies a rate loss and therefore a trade-off between the decoder threshold, i.e. the maximum noise level tolerated by the decoder, and the error-floor. Also, this approach requires deep interleaving with long latency to break the error bursts that are present after the inner decoder and to avoid overloading of the outer decoder.

If an outer algebraic code is not desired, the error floor must per design lie below the target error rate. This is often achieved by a concatenation of component codes with large Hamming distance. However, this solution may result into a significant decoding complexity, especially for high data rate applications.

A very efficient code construction is provided by the Braided Block Codes (BBC) introduced by D. Truhacev, M. Lentmaier, and K. Zigangirov in "*On Braided Block Codes*", IEEE ISIT, June-July 2003. BBCs are convolutional codes obtained from an orthogonal concatenation of two block codes and achieve an excellent error correcting performance. In A. Jiménez Feltström, d. Truhacev, M. Lentmaier, and K. Sh. Zigangirov, "*Braided Block Codes*", IEEE Transactions on Information Theory, June 2009, a method of computing an ensemble distance bound for BBCs are described along the lines of similar derivations for other code families. However, ensemble bounds on the minimum distance do not guarantee the error floor of a specific code. From the engineer's perspective, it would hence be more useful to lower-bound per design the minimum Hamming distance of the code considered for implementation. Furthermore, the bound for BBCs shows that their overall constraint length, and thus, unfortunately also their latency and complexity, grow rapidly with the length and the rate of the component codes.

In some cases, the minimum Hamming distance is not the dominant parameter for the error floor to occur. For instance, for LDPC codes under message passing decoding, the error floor is usually determined by pathological patterns associated with absorbing sets in the bipartite graph rather than by the minimum Hamming distance, as can be seen from Z. Zhang, L. Dolecek, B. Nikolic, V. Anantharam, and M. Wainwright, "*Investigation of error floors of structured low-density parity-check codes by hardware emulation*", IEEE GLOBECOM, November 2006. Several techniques for the identification and post-processing of absorbing sets have been described in the literature. However, they require lengthy emulations, which are typically carried out on an FPGA. Due to the limited FPGA speed, a residual risk of overlooking some critical patterns remains, especially in high-rate applications with very low target bit error rate, such as $BERs \leq 10^{-12}$.

SUMMARY OF THE INVENTION

A problem underlying the invention is to provide an encoder and a convolutional coding scheme which by design allow to lower-bound the minimum Hamming distance and by this to rule out the existence of an error floor down to a given target BER, while still allowing to keep the resulting constraint length low.

This problem is solved by an encoder according to claim 1 and a coding method of claim 16. The invention further provides a corresponding decoder. Preferable embodiments are defined in the dependent claims.

According to one aspect of the present invention, an encoder for encoding digital data is provided. The encoder comprises one or more component encoders, each component encoder being a systematic block encoder suitable for encoding a local information word such as to generate a local code word including the local information word and a number of parity bits, one or more interconnections, said interconnections connecting different ones of said component encoders or connecting a component encoder with itself, one or more inputs for inputting external digital information to corresponding one or more of the component encoders, and one or more outputs for outputting encoded digital data from at least a subset of the component encoders.

Herein, the term "information word" generally refers to a block of digital data. The term "external digital information" refers to digital information that is inputted from outside the encoder, or in other words, that has not been processed by any of the component encoders yet. The term "local information word" refers to a word that is to be processed by a given component encoder within the total encoder, and is "local" in the sense that it is local to this given component encoder. While the local code word is said to include the local information word, this does not imply that the respective bits are arranged in a compact block within the local code word, but only defines that all bits of the local information word are contained somewhere within the local code word.

The encoder is configured to carry out a sequence of processing steps, wherein each processing step comprises the following steps:
  combining, at at least a subset of said component encoders, internal input bits received via a corresponding one of said interconnections and external input bits received via the corresponding input, if present, to assemble a local information word,
  encoding the local information word such as to generate a local code word including the local information and a number of parity bits, and
  outputting, from at least some of said component encoders, a reduced local code word via the corresponding output, and handing the same reduced local code word over to said interconnections for forwarding said same reduced code word via said interconnections to another component encoder or to itself, wherein said reduced local code word corresponds to the parity bits and the external input bits, but not the internal input bits received via the interconnection.

Accordingly, while the component encoders encode a local information word such as to generate a local code word including the local information and a number of parity bits generated therefrom, only a reduced local code word is outputted to the outside, and only this reduced local code word is forwarded via the interconnection to another component encoder. During each processing step, a reduced code word is handed over to the interconnection, while the forwarding of the bits of the reduced code word via the interconnection will generally take place in the course of consecutive processing steps, and due to bit-wise delays in the forwarding described below, the individual bits of the reduced code words will arrive at the respective component encoder at different times. Bits received at a component encoder via the interconnection are referred to as "internal input bits" herein, because they are bits that have already been processed by a component encoder. These internal input bits are combined with external input bits received via a corresponding input to form the local code word for the next processing step. The reduced local code word corresponds to the parity bits and the external input bits, while the internal input bits that have already been received via the interconnection are discarded.

Further, as indicated above, the encoder of the invention is configured to forward on each interconnection bits of the reduced local code in parallel, but with delays that are mutually different for at least a subset, preferably mutually different for all, of reduced local code word bits. From a functional point of view, the interconnection can hence be regarded as a parallel bus having as many lanes as there are bits in the reduced local code word and where a distinctive delay is associated with each of the lanes. However, the invention is not limited to any specific physical implementation of the encoder, and can in particular be formed by a multipurpose processor under suitable program control. Accordingly, terms like interconnection, input and output are to be regarded as purely functional in the present disclosure.

Finally, the number of component encoders is either one, or the number of component encoders may be two or more, in which case at least one of the component encoders does not have an input for inputting external digital information.

The above-referenced features define a new class of encoders, where the number of component encoders, the number and topology of the interconnections, the number of inputs and the number of outputs can be chosen such as to lower-bound per design its minimum Hamming distance and by this to rule out the existence of an error floor down to a given target BER. In particular by means of the interconnections and the rules for generating and forwarding reduced local code words, this encoder allows for a code concatenation technique that results into a large minimum distance and a low constraint length with a correspondingly low latency and complexity. Namely, by choosing the number of component codes and their interconnections, a desired minimum free distance can be obtained in spite of employing comparatively simple component codes, thereby keeping the resulting constraint length low. Further, as will be shown in detail below, this type of encoder allows for deriving an efficient decoder architecture for the codes obtained with the encoders of the invention.

In a preferred embodiment, each component encoder is connected to receive reduced code words via at least one interconnection. However, as stated above, except for the case that only a single component encoder is used, there is at least one component encoder that does not have an input for inputting external digital information. This leads to an asymmetry in the encoder, which among other things has the consequence that the number of bits forwarded in parallel on different interconnections within the encoder will differ. As will be explained in more detail below, this has a number of practical advantages in the implementation and also in further developments of the encoding scheme.

In a preferred embodiment, the number of inputs for inputting external digital information is only one half of or even less than one half of the number of component encoders.

In a preferred embodiment, each component encoder however has a corresponding output for outputting a reduced code word.

In a preferred embodiment, the number of component encoders is one, two or four.

In the simplest embodiments, one bit of the reduced code words will be forwarded via the interconnection without delay, or with a constant offset, and all further bits would be forwarded with an additional delay of one, two, three . . . unit delays, where the unit delays could for example correspond to a clock cycle. In this scenario, the unit delay would at the same time be the "minimum delay" between two bits forwarded in parallel on the interconnection, and in the simplest case, the minimum delays on all interconnections within the encoder are identical. The other delays could then be integer multiples of said minimum delay.

However, deviating from this simplest case, in a preferred embodiment, the minimum delay between bits on each of at least two different interconnections within the encoder are chosen to be different from each other. In addition or alternatively, the sets of delays on at least two different interconnections may have a different constant offset. Herein, the difference in minimum delay and/or the offset(s) is/are preferably chosen such as to increase the minimum free distance of the resulting code as compared to operating the same encoder with identical minimum delays and/or identical constant offset. Namely, as will be demonstrated below with reference to specific examples, the minimum free distance of the encoder as a whole can be increased by choosing suitable minimum delays and/or suitable offsets.

For example, in one embodiment, the width of the reduced code words forwarded on a first interconnection is m, and the minimum delay between bits on this first interconnection is $S \cdot t_0$. Further, the width of the reduced code words forwarded on the second interconnection is n, and the minimum delay between bits on the second interconnection is at least $m \cdot S \cdot t_0$, wherein S is a positive integer and $t_0$ is a unit time, in particular a clock cycle time. Graphically speaking, this means that the granularity in the delays of the second interconnection is coarser than on the first interconnection. Herein, preferably m is smaller than n.

In a preferred embodiment, the delays on the first interconnection have a first constant offset $\Delta_1 \cdot t_0$ and the delays on said second interconnection have a second constant offset $\Delta_2 \cdot t_0$, wherein $\Delta_1$ and $\Delta_2$ are non-negative integers chosen such that $2(\Delta_1 + \Delta_2)$ is not a multiple of S, and preferably such that $(\Delta_2 + \Delta_1)$ is not a multiple of S.

Further, the present invention relates to a decoder for decoding a code generated by an encoder according to one of the above embodiments, comprising at least one component decoder corresponding to each of the component encoders of said encoder, each component decoder having twice as many ports as the corresponding component encoder. Herein, the decoder may include several instances of the component decoder corresponding to the same component encoder to provide for several decoding iterations.

In the decoder, the ports of the component decoders are preferably connected by interconnections corresponding to the interconnections in the underlying encoder, where on interconnections with reverse direction as compared to the underlying encoder, the sign of the delays is reversed. Herein, since truly negative delays cannot be realized, an appropriate delay offset on all interconnections may be introduced.

SHORT DESCRIPTION OF THE FIGURES

Figure 2:
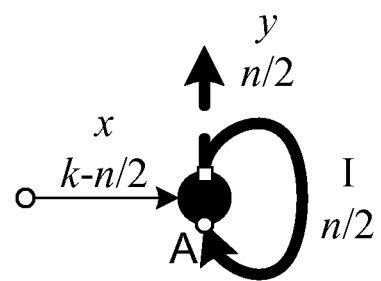
Figure 3:
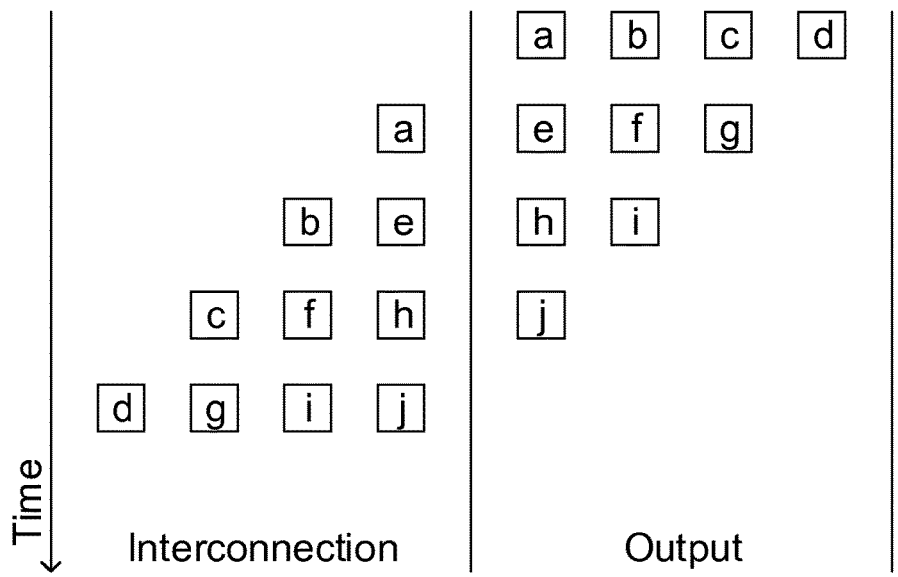
Figure 4:
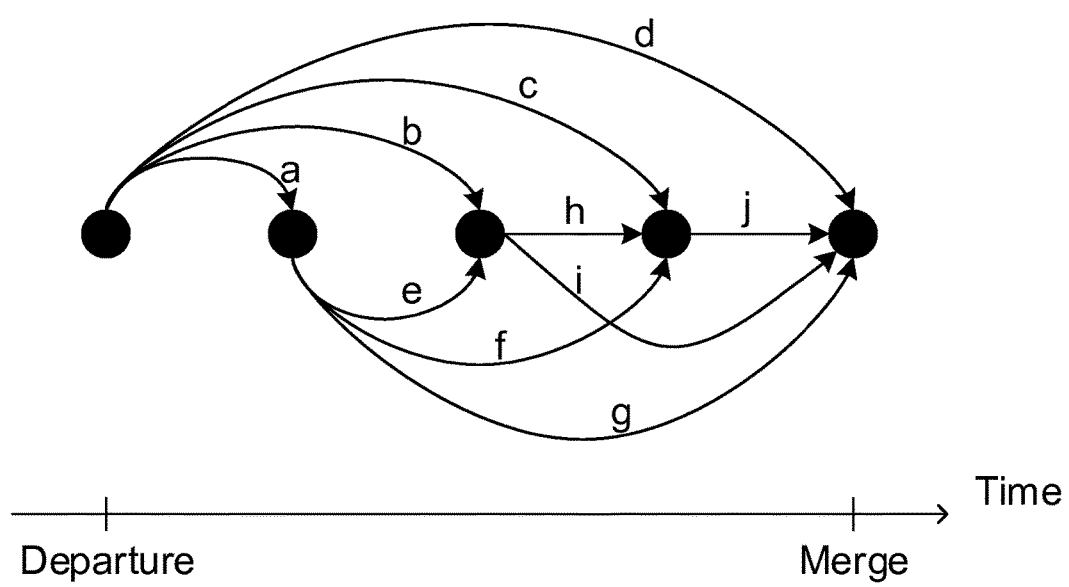
Figure 5:
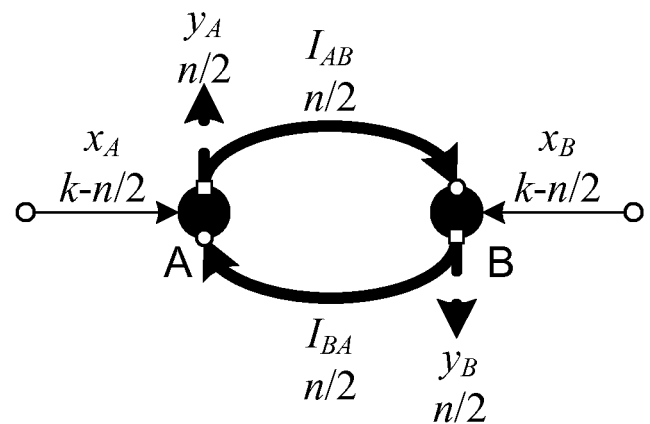
Figure 6:
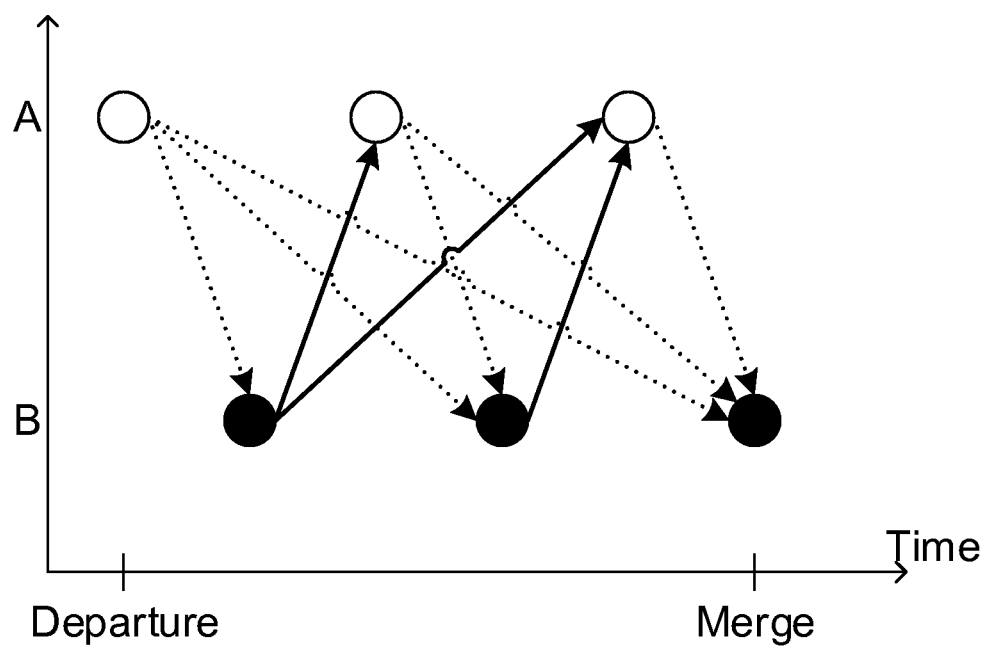
Figure 7:
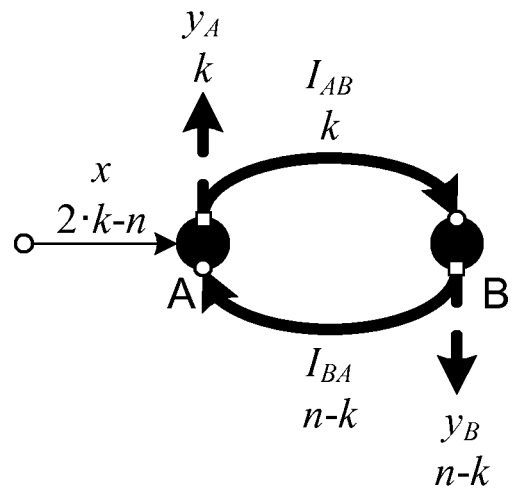
Figure 8:
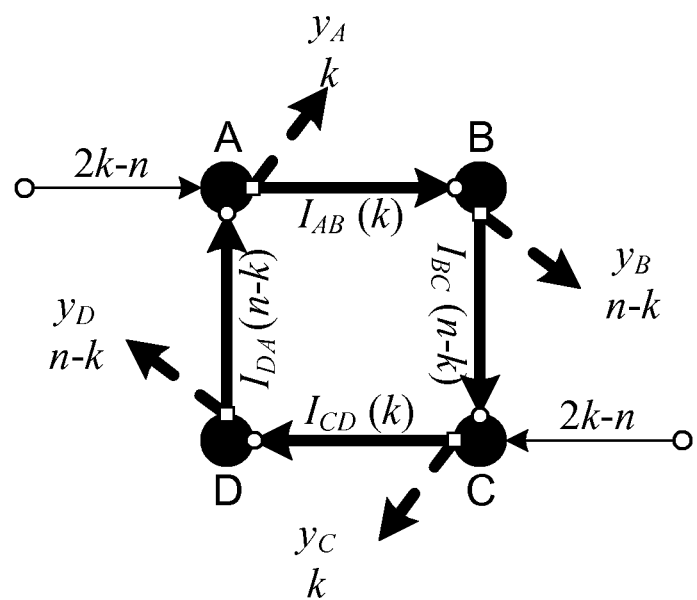
Figure 9:
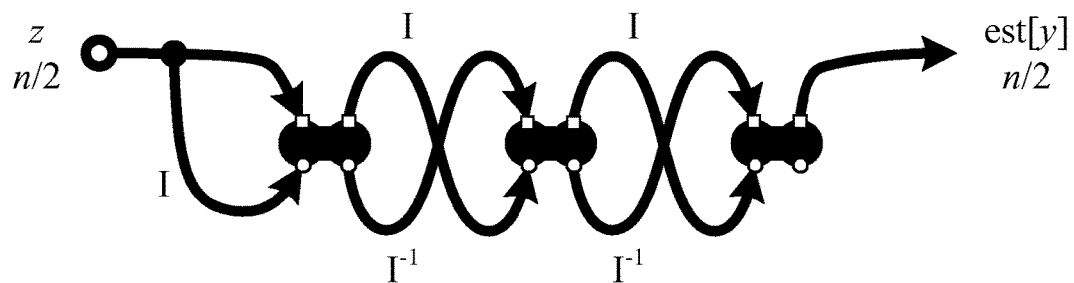
Figure 10:
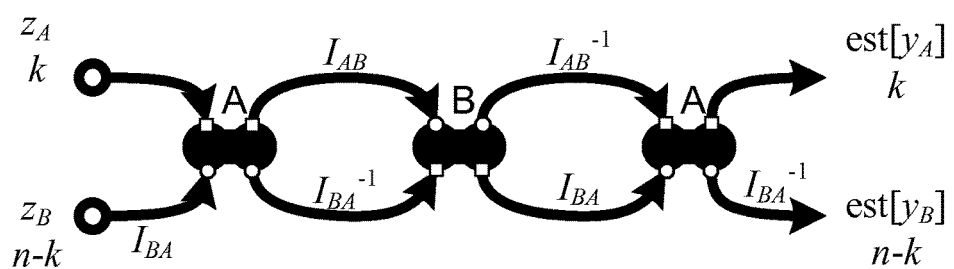
Figure 11:
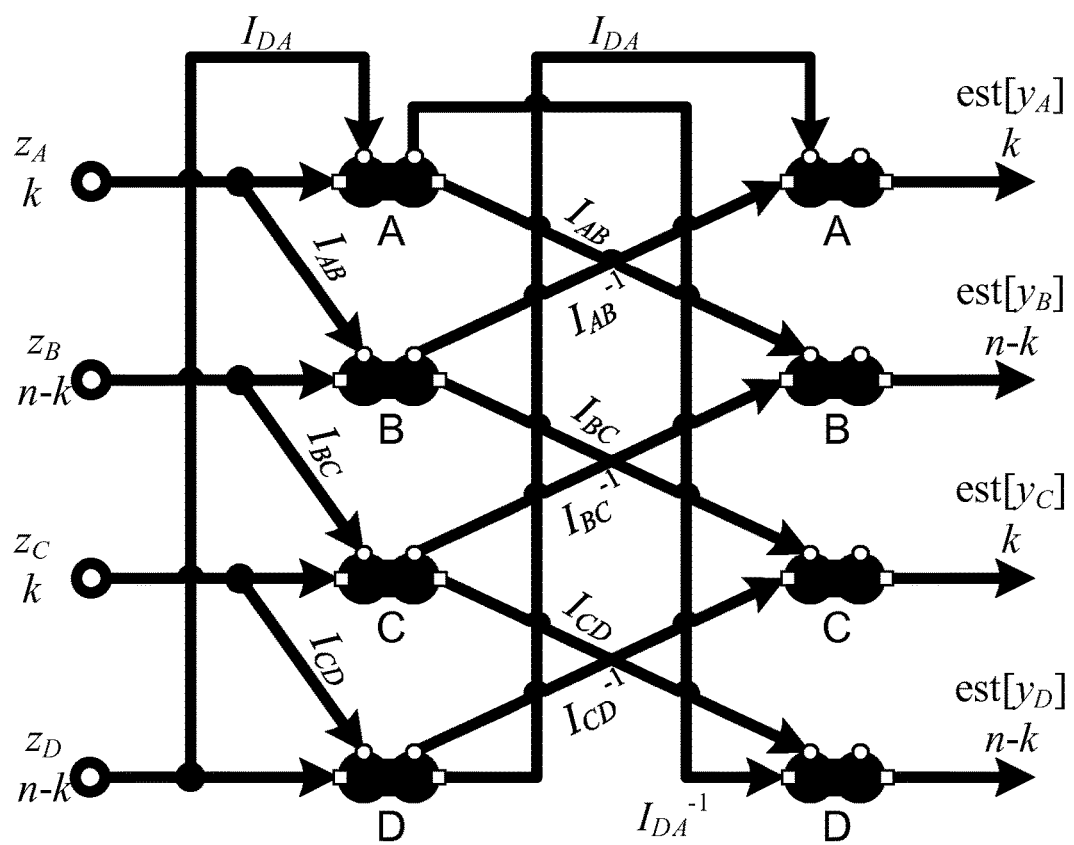

FIG. 1 is a schematic representation of an encoder according to an embodiment of the present invention, FIG. 2 is a schematic representation of the simplest encoder according to the present invention which includes a single component encoder, a single input and an interconnection that circles back to the single component encoder, FIG. 3 is a diagram illustrating how non-zero bits may occur in the output and the interconnection of the encoder of FIG. 2 in the shortest possible detour from the zero-state in the trellis diagram, FIG. 4 is a graphical illustration of the minimum weight detour identified in FIG. 3, FIG. 5 is a schematic representation of a BBC according to prior art, FIG. 6 is a schematic diagram illustrating the minimum weight detour for the BBC of FIG. 5 with a Hamming distance d of the component code of d=3, FIG. 7 shows a further encoder according to an embodiment of the present invention employing two component encoders but only one input, FIG. 8 shows a further encoder according to an embodiment of the present invention employing four component encoders but only two inputs, FIG. 9 is a schematic representation of a decoder corresponding to the encoder of FIG. 2, FIG. 10 is a schematic representation of a decoder corresponding to the encoder of FIG. 7, and FIG. 11 is a schematic representation of a decoder corresponding to the encoder of FIG. 8.

DESCRIPTION OF THE PREFERRED EMBODIMENTS

For the purposes of promoting an understanding of the principles of the invention, reference will now be made to the preferred embodiments illustrated in the drawings and specific language will be used to describe the same. It will nevertheless be understood that no limitation of the scope of the invention is thereby intended, such alterations and further modifications in the illustrated device and method and such further applications of the principles of the invention as illustrated therein being contemplated therein as would normally occur now or in the future to one skilled in the art to which the invention relates.

FIG. 1 shows an exemplary embodiment of an encoder according to an embodiment of the present invention. In FIG. 1, each of the black circles represents a component encoder of a component block code. In the embodiment of FIG. 1, four component encoders A, B, C and D are shown. The thin black arrows represent inputs for inputting external digital information to a corresponding one of the component encoders. For example, the thin black lines may represent busses carrying external bit words $x_a$, $x_b$ and $x_d$ to the component encoders A, B and D, respectively.

The thick black arrows represent interconnections interconnecting different ones of the component encoders, or connecting a component encoder with itself, as is the case for the interconnection starting and ending at component encoder B. In the following description, it is assumed that the interconnections are formed by parallel busses, over which a plurality of bits can be forwarded in parallel. However, it is to be understood that no limitation to the actual physical implementation of the encoder is thereby intended, and that the entire encoder can be in particular embodied by software operating on a suitable processor, where no individual busses, inputs and outputs could be attributed to the components described below.

Further shown in FIG. 1 are outputs, represented by thick broken line arrows, for outputting encoded digital data from the corresponding one of the component encoders, in the present example from the encoders A, B, C and D carrying output code words $y_a$, $y_b$, $y_c$ and $y_d$, respectively.

In FIG. 1, the interconnections and outputs each emerge at a corresponding output port represented by a square. Further, each of the interconnections terminates at the receiving component encoder at an input port represented by a circle (in case all four component encoders A to D) or a triangle (in case of component encoders B and D).

The encoder of FIG. 1 is configured to carry out a sequence of processing steps, each processing step comprising the following steps:

1. At each of the encoders A to D, the internal input bits received via the corresponding one of the interconnections (thick arrows) and the external input bits received via the corresponding input (thin arrows), if present, are combined to assemble a local information word.

As is seen in FIG. 1, in case of encoders A, B and D, external input bits $x_a$, $x_b$ and $x_d$ are combined with internal input bits received via one interconnection (in case of component encoder A), or two interconnections (in case of encoders B and D). Note that component encoder C does not have an input for inputting external digital information so that the local information word is based only on internal input bits, i.e. input bits provided from component encoder A and forwarded via the interconnection between component encoders A and C.
2. Further, each of the component encoders A to D encodes the local information word such as to generate a local code word including the local information and a number of parity bits.
3. Each of the component encoders A to D outputs a reduced local code word $y_a$, $y_b$, $y_c$ and $y_d$ via the corresponding output (thick dashed line) and also hands over the same reduced local code word to the corresponding outgoing interconnections for forwarding the same reduced local code word via all of its interconnections to another component encoder or—in case of component encoder B—to itself. Herein the "reduced local code word" corresponds to the parity bits and the external input bits only, but not to the internal input bits that have been received via the interconnection in the previous step. Herein, the term "handing over to the interconnections for forwarding" shall indicate in general terms that respective bits of the reduced local code words will be forwarded along the interconnections, but in the course of later processing steps and with different delays between individual bits of the reduced local code word. This forwarding will be carried out in parallel with the above three steps and with a timing that is governed by the delays of the individual interconnection lanes. Another way of saying this is that the reduced local code word is "outputted to the interconnection". Note that the three steps described above will typically be carried out in parallel: During each unit time, e.g. each clock cycle of an underlying clock, internal and external bits are combined to assemble the local information word and provided to the encoder, while simultaneously a local code word generated is handed over to the interconnection.

Next, with reference to FIG. 2, the simplest component encoder compatible with the rules introduced above will be described and analyzed in more detail. The encoder of FIG. 2 consists of a single component encoder of a (n, k) block code, where k is the number of bits in the local information word and n is the number of bits in the local code word which includes the local information and a number of n−k parity bits. Herein, k is assumed to be larger than n/2, or in other words, the code rate k/n of the component encoder is larger than 1/2.

In FIG. 2, the corresponding bit-width is illustrated beside each interconnection, referred to as "bus" in the following. As is seen therein, in each clock cycle, a data block or word x of k−n/2 external input bits are inputted to the component encoder A. These k−n/2 bits are combined with n/2 internal bits received via the interconnection, such as to assemble a local information word of length k. Note that this "local information word" hence includes both, external bits received via an input, i.e. bits from outside the concatenated code, as well as internal bits received via the interconnection, or in other words, from inside the concatenated code. The thus assembled local information word of length k is encoded such as to generate a local code word of length n, including the local information and n−k parity bits. However, while the local code word, i.e. the result of the encoding of the encoder A has a length of n bits, only a reduced local code word y of a length of n/2 bit is outputted from the output (square symbol in FIG. 2) and also forwarded, more precisely circled back via the interconnection (with individual delays between the bits). Namely, according to the present invention, the reduced local code word corresponds only to the k−n/2 input bits and the n−k parity bits, while the part of the local information word originating from the incoming interconnection is discarded. Accordingly, it is seen that the concatenated convolutional code has a rate (k−n/2)/(n/2)=(2·k/n−1).

A lower-bound of the free distance of the concatenated convolutional code can be determined by analyzing a detour from the zero-state in the trellis diagram. For illustration purposes, let us consider a binary component block code and denote its minimum Hamming distance by d. At the departure from the zero state, encoder A must therefore emit at least d non-zero bits in the worst case, i.e. in the case of the shortest possible detour. This is illustrated in FIG. 3 for the case of d=4. At time 0, the component encoder A emits a local code word including at least four non-zero bits "a", "b", "c" and "d". These non-zero bits (i.e. "1s") are forwarded to the output and to the outgoing interconnection bus. Since all the delays within an interconnection bus are distinct, the d nonzero bits return to encoder A at distinct clock cycles. When bit "a" is recircled to the encoder A, it generates a new non-zero code word of a weight of at least d, i.e. with at least four non-zero bits again. While bit "a" is not sent to the output again, the at least three newly generated 1s, referred to as bits "e", "f" and "g" in FIG. 3, are forwarded both to the output and to the interconnection bus. In the least favorable case, the arrival time of these bits to encoder A over the interconnection bus collides with the arrival time of the bits "b", "c" and "d", respectively. This is the "worst case" because the more 1s simultaneously arrive via the interconnection (which will be discarded in the next encoding step), the fewer 1s ("h" and "i") as a response to the bits "b" and "e" need to be generated. If similar worst case conditions apply also to the newly generated bits, the detour merges again into the zero state when encoder A receives the bits "d", "g", "i" and "h" over the interconnection bus and these form a valid code word without the emission of additional non-zero bits.

Obviously, we cannot exclude these worst case events without a thorough and complex analysis of the interleaving in the interconnection busses and the mapping in the component encoder. Therefore, in the general case, we can provide at least a lower-bound of the free distance of the structure in FIG. 2 by $d \cdot (d+1)/2$.

A graphical illustration of the minimum weight detour is presented in FIG. 4, where the connections represent the non-zero input and output bits of the encoder over time. Note that the encoder has d connections at each time instant; at the departure time all connections are outgoing; at the merge time all connections are incoming. The overall number of connection branches in the graph is the weight of the detour. Since all delays in an interconnection bus are different from each other, the branches cannot form cycles of length 2. However, cycles of length 3, as e.g. a-b-e or b-c-h, are possible. When identifying the cycles, the orientation of the connection branches is immaterial.

Based on the above general criteria, a whole new class of encoders can be constructed, by choosing the number of component encoders, the number of inputs and the individual delays on the interconnections (to be described in more detail below). For each of the possible codes, the desired minimum free distance can be calculated in a similar way as indicated above with reference to the embodiment of FIG. 2, and the corresponding error floor can be estimated. Importantly, the encoder architecture can be adapted such that the desired minimum free distance is obtained in spite of using comparatively simple component codes and thereby keeping the resulting constraint length and decoding complexity low.

It should be noted here that a parallelized version of the BBC's of D. Truhacev, M. Lentmaier, and K. Zigangirov is actually in agreement with most of the above construction criteria, although it nevertheless does not fall into the terms of the invention as defined above. However, to highlight the similarities and the differences with the codes according to the invention it is worthwhile to discuss the BBC in more detail with reference to FIG. 5 below.

For this purpose it is assumed that the BBC of Truhacev et al. shall use two component encoders of the same binary (n, k) code with a code rate larger than 1/2. The concatenated convolutional code then has a rate of 2·k/n−1. FIG. 6 illustrates a minimum weight detour for the case of d=3. The minimum cycle length in the detour graph is 4. In the general case, the free distance of the BBC can be lower-bounded by $d^2$.

Note that the BBC of FIG. 5 does not fall into the terms of the invention, since it employs two component encoders and two inputs. A similar code according to the invention is shown in FIG. 7. As for the BBC, it also employs two encoders for a binary (n, k) code with a code rate larger than 1/2. The concatenation, however, is asymmetric in the sense that only encoder A is connected to an external input bus and that the two interconnection busses have different widths. Namely, the interconnection bus from A to B has a width of k bits, which is a little larger than n/2, while the interconnection bus from B to A has only a width of n−k bits, which is typically comparably small. The code rate of the concatenation is still 2·k/n−1.

For this new code, which can be regarded as the embodiment of the present invention that is the most similar to the BBC, the minimum free distance can be dramatically increased by defining additional requirements for the interconnection delays as follows:

The interconnection bus from B to A implements the delays $\{0; 1, \ldots, n-k-1\} \cdot S + \Delta_{BA}$, and the interconnection bus from A to B implements the delays $\{0; 1, \ldots, k-1\} \cdot (n-k) \cdot S + \Delta_{AB}$.

Herein, the delays are defined by integer numbers and would need to be multiplied with a unit time $t_0$, for example a clock cycle, which is however omitted for simplicity in the following description.

$\Delta_{BA}$ and $\Delta_{AB}$ are two nonnegative integers and S is any positive integer that does not divide $\Delta_{BA}+\Delta_{AB}$. This requirement can for example be met by setting $S>\Delta_{BA}+\Delta_{AB}$. The minimum delay between any two bits on the interconnection bus from B to A is hence S, while the minimum delay between any two bits on the interconnection bus from A to B is (n−k)·S. It is seen that these conditions guarantee that the accumulated delay over a path A→B→A→B cannot conflict with the delay of a path A→B and, similarly, that two distinct loops A→B→A undergo different delays. In other words, no cycles of length 4 are possible, and the minimum weight detours that determine the asymptotic performance of a BBC are ruled out. In fact, one can lower-bound of the free distance of the code by $d+d \cdot (d-1) + d \cdot (d-1)^2$. Note that the free distance has accordingly a cubic term in d, which means that it is much larger than the free distance of the BBC, which is only quadratic in d. It is further emphasized that if the component code has a high code rate, the difference n−k is reasonably small, such that the required delays are feasible. This demonstrates how the asymmetry in the width of the busses allows for a favorable implementation that is not possible with the ordinary BBC.

FIG. 8 shows a yet further exemplary encoder using four identical component encoders A, B, D, C for a binary (n, k) block code with rate larger than 1/2. The resulting concatenation has a code rate of 2·k/n−1. The encoder of FIG. 8 is constructed according to the same rules as defined above, and a detailed description thereof is accordingly omitted.

The free distance of the code can be increased significantly if we choose different minimum delays on different interconnections and suitable constant offsets for the delays. For example, in the encoder of FIG. 8, the interconnection busses from B to C and from D to A may implement the delays $\{0; 1, \ldots, n-k-1\} \cdot S + \Delta_1$, while the interconnection busses from A to B and from C to D may implement the delays $\{0; 1, \ldots, k-1\} \cdot (n-k) \cdot S + \Delta_2$, where $\Delta_1$ and $\Delta_2$ are two nonnegative integers and S is any positive integer that does not divide $2 \cdot (\Delta_1+\Delta_2)$. Herein, again the delays are represented by integer numbers, which in practice may be multiplied with a unit time $t_0$, such as a clock cycle.

It is seen that the minimum delays between any two bits on the busses from B to C and D to A amount to S, while the minimum delays on the busses from A to B and from C to D amount to (n−k)·S. With these delays, one can determine a lower-bound of the free distance of the code by $d+d \cdot (d-1)+d \cdot (d-1)^2+d \cdot (d-1)^3$. In other words, the minimum free distance of the code scales with the fourth power of minimum Hamming distance d of the component encoders A to D. This illustrates how by adding additional component encoders according to the general construction scheme defined above, the minimum free distance as a function of d can be increased, and how a lower-bound of a minimum free distance can be determined in a straight-forward manner. As a result, if a certain application requires a given BER, then the code can be constructed accordingly, based on the general rules presented above, to meet this criterion. Further, a desired minimum free distance can be achieved even employing simple codes and thereby keeping the resulting constraint length and complexity low, by employing a higher number of component codes.

The encoders of FIGS. 2, 7 and 8 are just three illustrative examples of the new class of encoders defined by the present invention. Based on the design rules defined above, many alternative encoders can be constructed to meet desired error floor requirements.

In the following, examples of a possible decoder architecture corresponding to the encoders of the invention shall be explained. The skilled person will appreciate that different decoding algorithms can be applied to the same code, and that the codes provided by the encoders described above is not bound to be decoded with any of the specific decoders introduced in the following. However, the decoder architectures described next are particularly advantageous both in view of their simplicity as well as their generality in the sense that the decoders can be easily derived from any corresponding encoder structure.

FIG. 9 illustrates a decoder for the self-concatenated block code obtained with the encoder of FIG. 2. The symbol consisting of two connected black circles represents a component decoder, while the small white squares and circles represent the component decoders' ports. Each component has twice as many ports as the corresponding component encoder. In the figures, the inputs are shown on the left side and the outputs on the right side. Of the two input ports of the decoder, one is symbolized with a square, indicating that it corresponds to the output port of FIG. 2, and one is symbolized with a circle, indicating that it corresponds to the input port of FIG. 2. The decoder of FIG. 9 receives n bits, namely n/2 via each of its input ports, and outputs n bits, again n/2 via each of its output ports. Any type of hard-decision or soft-decision decoder can be used within in this architecture. The nature of the signals carried by the interconnection busses and the performance of the iterative decoder, for example its ability to decode up to half the minimum free distance, depend on the used component decoders.

The signal z is the channel output corresponding to the encoded sequence y of FIG. 2. FIG. 9 shows three instances of the component decoder corresponding to three decoding iterations. After the last iteration the decoder returns the estimate est[y] of y, which also includes an estimate of the information word x, because the component encoder is systematic. The decoders are connected by interconnection busses I corresponding to the interconnection busses of the corresponding encoder (see FIG. 2), and "inverse" interconnection busses $I^{-1}$, depending on their orientation with respect to the ports of the component decoders. Namely, as is seen in FIG. 9 (and likewise in FIGS. 10 and 11), each interconnection between a square output port of one decoder and a circular input code of a following decoder corresponds to a direct interconnection, corresponding to one of the interconnections in the corresponding encoder, where the interconnections always connect an encoder output port (square port) with an encoder input port (circular port). However, interconnects connecting a circular output port of a decoder with a square input port of another decoder have the reverse orientation and hence correspond to "an inverse interconnection bus $I^{-1}$". The direct connections I implement the same set of delays as in the encoder, while the inverse connections $I^{-1}$ implement, in line of principle, the inverse set of delays. Since, however, "negative delays" are not possible, in practice it is necessary to introduce some additional delay on the inverse interconnections and, in order to maintain the correct timing alignment, also in the direct connections. This delay increases the decoding latency, but does not affect computational burden and performance.

If hard-decision decoders are used, the interconnection busses carry tentative decisions that are propagated and improved at each subsequent stage. In case of soft decision decoding, a belief propagation approach is adopted. The interconnection busses carry both the channel probabilities and the extrinsic probabilities computed at the previous stage. The decoder updates the extrinsic probabilities and forwards them together with the channel probabilities to the next stage. The interconnection busses guarantee that each component decoder receives the correctly delayed input at any stage.

FIG. 10 shows a decoder for the asymmetric concatenation of two block codes of FIG. 7, which is constructed in a similar way as the decoder of FIG. 9.

Further, FIG. 11 illustrates an iterative decoder for the encoder shown in FIG. 8. Herein, four component decoders are used per iteration to obtain the maximal degree of parallel processing and a minimal latency. However, an implementation with a single decoder per iteration is also possible and can be derived directly from the scheme of the encoder.

The embodiments described above and the accompanying figures merely serve to illustrate the device and method according to the present invention, and should not be taken to indicate any limitation thereof. The scope of the patent is solely determined by the following claims.

The invention claimed is:

1. An encoder for encoding digital data, said encoder comprising one or more component encoders, each component encoder being a systematic block encoder suitable for encoding a local information word such as to generate a local code word including the local information word and a number of parity bits, one or more interconnections, said interconnections connecting different ones of said component encoders or connecting a component encoder with itself, one or more inputs for inputting external digital information to corresponding one or more of the component encoders, and one or more outputs for outputting encoded digital data from at least a subset of the component encoders, wherein the encoder is configured to carry out a sequence of processing steps, each processing step comprising the following steps:

combining, at least a subset of said component encoders, internal input bits received via a corresponding one of said interconnections and external input bits received via the corresponding input, if present, to assemble a local information word, encoding the local information word such as to generate a local code word including the local information and a number of parity bits, and outputting, from at least some of said component encoders, a reduced local code word via the corresponding output, and handing the same reduced local code word over to a corresponding one of said interconnections for forwarding said same reduced local code word via said interconnection to another component encoder or to itself, wherein said reduced local code word corresponds to the parity bits and the external input bits, but not the internal input bits received via the interconnection, wherein said encoder is configured to forward on each interconnection bits of the reduced local code word in parallel but with delays that are mutually different for at least a subset of the reduced local code word bits, wherein a number of component encoders is one, or wherein a number of component encoders is two or more, of which at least one component encoder does not have an input for inputting external digital information.

2. The encoder of claim 1, wherein each component encoder is connected to receive reduced code words via at least one interconnection.

3. The encoder of claim 1, wherein each component encoder has a corresponding output for outputting a reduced code word.

4. The encoder of claim 1, wherein a number of the inputs for inputting external digital information is one half of or less than one half of the number of component encoders.

5. The encoder of claim 1, wherein the number of component encoders is one, two or four.

6. The encoder of claim 1, wherein a minimum delay between bits on at least two different interconnections within the encoder are chosen to be different from each other.

7. The encoder claim 1, wherein sets of delays on at least two different interconnections have a different constant offset.

8. The encoder of claim 6, wherein the difference in minimum delay and/or the offset are chosen such as to increase minimum free distance of a resulting encoding as compared to operating the same encoder with identical minimum delays and/or identical constant offset.

9. The encoder of claim 6, wherein width of the reduced code words forwarded on a first interconnection is in and the minimum delay between bits is $S \cdot t_0$, and wherein a width of the reduced code words forwarded on a second interconnection is n and the minimum delay between bits is at least in $m \cdot S \cdot t_0$, where S is a positive integer and $t_0$ is a unit time, in particular a clock cycle time.

10. The encoder of claim 9, wherein in m<n.

11. The encoder of claim 9, wherein the delays on the first interconnection have a first constant offset $\Delta_1 \cdot t_0$, and the delays on said second interconnection have a second constant offset $\Delta_2 \cdot t_0$, wherein $\Delta_1$ and $\Delta_2$ are non-negative integers chosen such that $2(\Delta_1+\Delta_2)$ is not a multiple of S, preferably such that $(\Delta_2+\Delta_1)$ is not a multiple of S.

12. The encoder of claim 1, wherein each processing step corresponds to one clock cycle of an encoder clock.

13. The encoder of claim 1, wherein each interconnection is formed by a parallel bus having a plurality of lanes, wherein a corresponding delay is associated with each lane.

14. A decoder for decoding a code generated by an encoder according to claim 1, comprising at least one component decoder corresponding to each of the component encoders of said encoder, each component decoder having twice as many ports as the corresponding component encoder.

15. The decoder according to claim 14, wherein the ports of the component decoders are connected by interconnections corresponding to the interconnections in the underlying encoder,
where on interconnections with reverse direction as compared to the underlying encoder, the sign of the delays is reversed.

16. A method for encoding digital data using an encoder, said encoder comprising
one or more component encoders, each component encoder being a systematic block encoder suitable for encoding a local information word such as to generate a local code word including the local information word and a number of parity bits,
one or more interconnections, said interconnections connecting different ones of said component encoders or connecting a component encoder with itself,
one or more inputs for inputting external digital information to corresponding one or more of the component encoders, and
one or more outputs for outputting encoded digital data from at least, a subset of the component encoders,
said method comprising a sequence of processing steps, each processing step comprising the following steps:
combining, at least a subset of said component encoders, internal input bits received via a corresponding one of said interconnections and external input bits received via the corresponding input, if present, to assemble a local information word,
encoding the local information word such as to generate a local code word including local information and a number of parity bits, and
outputting, from at least some of said component encoders, a reduced local code word via the corresponding output, and handing the same reduced local code word over to a corresponding one of said interconnections for forwarding said same reduced local code word via said interconnection to another component encoder or to itself, wherein said reduced local code word corresponds to the parity bits and external input bits, but not internal input bits received via the interconnection,
wherein said encoder is configured to forward on each interconnection bits of the reduced local code in parallel but with delays that are mutually different for at least a subset of reduced local code word bits,
wherein a number of component encoders is one, or wherein a number of component encoders is two or more, of which at least one component encoder does not have an input for inputting external digital information.

17. The method of claim 16, wherein each component encoder is connected to receive reduced code words via at least one interconnection.

18. The method of claim 16, wherein each component encoder has a corresponding output for outputting a reduced code word.

19. The method of claim 16, wherein the number of inputs for inputting external digital information is one half of or less than one half of the number of component encoders.

20. The method of claim 16, wherein the number of component encoders is one, two or four.

21. The method of claim 16, wherein a minimum delay between bits on at least two different interconnections within the encoder are chosen to be different from each other.

22. The method of claim 16, wherein sets of delays on at least two different interconnections have a different constant offset.

23. The method of claim 21, wherein difference in minimum delay and/or offset are chosen such as to increase minimum free distance of a resulting encoding as compared to operating the same encoder with identical minimum delays and/or identical constant offset.

24. The method of claim 21, wherein width of the reduced code words forwarded on a first interconnection is m and the minimum delay between bits is $S \cdot t_0$, and wherein the width of the reduced code words forwarded on a second interconnection is n and the minimum delay between bits is at least $m \cdot S \cdot t_0$, where S is a positive integer and $t_0$ is a unit time.

25. The method of claim 24, wherein m<n.

26. The method of claim 24, wherein delays on the first interconnection have a first constant offset $\Delta_1 \cdot t_0$ and delays on said second interconnection have a second constant offset $\Delta_2 \cdot t_0$, wherein $\Delta_1$ and $\Delta_2$ are non-negative integers chosen such that $2(\Delta_1+\Delta_2)$ is not a multiple of S.

27. The method of claim 16, wherein each processing step corresponds to one clock cycle of an encoder clock.

28. The method of claim 16, wherein each interconnection is formed by a parallel bus having a plurality of lanes, wherein a corresponding delay is associated with each lane.

* * * * *